(12) United States Patent
Hirao et al.

(10) Patent No.: US 10,109,549 B2
(45) Date of Patent: Oct. 23, 2018

(54) SEMICONDUCTOR DEVICE AND POWER CONVERSION DEVICE USING SAME

(71) Applicant: Hitachi, Ltd., Chiyoda-ku, Tokyo (JP)

(72) Inventors: Takashi Hirao, Tokyo (JP); Kan Yasui, Tokyo (JP); Kazuhiro Suzuki, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/538,907

(22) PCT Filed: Dec. 24, 2014

(86) PCT No.: PCT/JP2014/084020
§ 371 (c)(1),
(2) Date: Jun. 22, 2017

(87) PCT Pub. No.: WO2016/103335
PCT Pub. Date: Jun. 30, 2016

(65) Prior Publication Data
US 2017/0352604 A1 Dec. 7, 2017

(51) Int. Cl.
*H01L 23/04* (2006.01)
*H01L 23/31* (2006.01)
(Continued)

(52) U.S. Cl.
CPC ........ *H01L 23/3192* (2013.01); *H01L 23/053* (2013.01); *H01L 23/291* (2013.01);
(Continued)

(58) Field of Classification Search
CPC . H01L 33/504; H01L 33/641; H01L 2924/00; H01L 23/31
(Continued)

(56) References Cited

U.S. PATENT DOCUMENTS 6,201,304 B1 * 3/2001 Moden .................. H01L 21/563
257/774
6,255,741 B1 * 7/2001 Yoshihara ............. B81B 7/0058
257/414
(Continued)

FOREIGN PATENT DOCUMENTS

JP  58-93359 A    6/1983
JP  62-004364  *  1/1987
(Continued)

OTHER PUBLICATIONS

Microfilm of the specification and drawings annexed to the request of Japanes Utility Model Application No. 19537/1986(Laid-open No. 100833/1988) (NEC Corp) Jun. 30, 1988, embodiments figure 2 (Family None).*

(Continued)

*Primary Examiner* — Rajnikant Patel
(74) *Attorney, Agent, or Firm* — Crowell & Moring LLP

(57) ABSTRACT

In order to improve productivity of a semiconductor device, while improving stability of the blocking voltage of the semiconductor device, this semiconductor device is characterized by having a semiconductor element, and a laminated structure having three resin layers, said laminated structure being in a peripheral section surrounding a main electrode on one surface of the semiconductor element. The semiconductor device is also characterized in that the laminated structure has, on the center section side of the semiconductor element, a region where a lower resin layer is in contact with an intermediate resin layer, and a region where the lower resin layer is in contact with an upper resin layer.

15 Claims, 7 Drawing Sheets

(51) Int. Cl.

| | |
|---|---|
| *H01L 23/29* | (2006.01) |
| *H01L 29/06* | (2006.01) |
| *H01L 29/16* | (2006.01) |
| *H01L 29/872* | (2006.01) |
| *H01L 23/053* | (2006.01) |
| *H01L 23/373* | (2006.01) |
| *H01L 23/00* | (2006.01) |
| *H01L 25/18* | (2006.01) |
| *H02M 7/537* | (2006.01) |
| *H02M 7/00* | (2006.01) |
| *H02P 27/06* | (2006.01) |

(52) U.S. Cl.
CPC .......... *H01L 23/293* (2013.01); *H01L 23/296* (2013.01); *H01L 23/3114* (2013.01); *H01L 23/3171* (2013.01); *H01L 23/3735* (2013.01); *H01L 24/32* (2013.01); *H01L 24/48* (2013.01); *H01L 24/73* (2013.01); *H01L 25/18* (2013.01); *H01L 29/0638* (2013.01); *H01L 29/1608* (2013.01); *H01L 29/872* (2013.01); *H02M 7/003* (2013.01); *H02M 7/537* (2013.01); *H01L 2224/32225* (2013.01); *H01L 2224/48225* (2013.01); *H01L 2224/73265* (2013.01); *H01L 2924/10253* (2013.01); *H01L 2924/10272* (2013.01); *H01L 2924/12032* (2013.01); *H01L 2924/13055* (2013.01); *H01L 2924/13091* (2013.01); *H01L 2924/14252* (2013.01); *H02P 27/06* (2013.01)

(58) Field of Classification Search
USPC ..... 257/13, 26, 34, 40, E27.12, 89, 98, 685, 257/686, 700, 737, 676, 730; 136/255, 136/256
See application file for complete search history.

(56) References Cited

U.S. PATENT DOCUMENTS

| | | | | |
|---|---|---|---|---|
| 6,677,621 B2* | 1/2004 | Yamazaki | ........... | H01L 51/5016 |
| | | | | 257/103 |
| 6,972,239 B1* | 12/2005 | Li | ........... | C23C 16/40 |
| | | | | 257/E45.003 |
| 7,067,926 B2* | 6/2006 | Yamazaki | ........... | H01L 21/6835 |
| | | | | 257/777 |

FOREIGN PATENT DOCUMENTS

| | | | |
|---|---|---|---|
| JP | 62-4364 | A | 1/1987 |
| JP | 63-100833 | U | 6/1988 |
| JP | 8-88298 | A | 4/1996 |
| JP | 2007-258710 | A | 10/2007 |
| JP | 2013-191716 | * | 9/2013 |
| JP | 2013-191716 | A | 9/2013 |
| JP | 2013-239607 | A | 11/2013 |

OTHER PUBLICATIONS

International Search Report (PCT/ISA/210) issued in PCT Application No. PCT/JP2014/084020 dated Feb. 24, 2015 with English translation (Four (4) pages).
Japanese-language Written Opinion (PCT/ISA/237) issued in PCT Application No. PCT/JP2014/084020 dated Feb. 24, 2015 (Five (5) pages).

* cited by examiner

SEMICONDUCTOR DEVICE AND POWER CONVERSION DEVICE USING SAME

TECHNICAL FIELD

The present invention relates to a semiconductor device and a power converter including the semiconductor device, more particularly to a high-voltage semiconductor device and a high-voltage power converter including the high-voltage semiconductor device.

BACKGROUND ART

High-voltage semiconductor devices including PN diodes, Schottky-barrier diodes (SBDs), metal oxide semiconductor field-effect transistors (MOSFETs), insulated gate bipolar transistors (IGBTs) are widely used. These high-voltage semiconductor devices are made of silicon, SiC, or GaN (gallium nitride). These high-voltage semiconductor devices are contained in power semiconductor modules to constitute high-voltage power converters. A high-voltage semiconductor device includes a field limiting area near the top surface of the semiconductor element, and a resin layer such as a polyimide layer on the top surface to stabilize the blocking voltage.

PTL 1 discloses a technique for forming a laminated structure of resin on the area near a SiC element to stabilize the blocking voltage.

PTL 2 discloses a technique for forming a laminated structure of resin in a resin-sealed electronic circuit.

PTL 3 disclosed a technique for forming a laminated structure of resin in a semiconductor memory element.

CITATION LIST

Patent Literatures

PTL 1: JP 2013-191716 A
PTL 2: JP 08-088298 A
PTL 3: JP 58-093359 A

SUMMARY OF INVENTION

Technical Problem

The inventors of the present invention found the following problems in the above semiconductor devices having the laminated structures of resin to stabilize the blocking voltage. The problems may preclude improving the productivity in manufacturing the semiconductor devices.

Conventional structures of the semiconductor devices may deteriorate the accuracy of image recognition in the packaging process. Especially when the laminated structure of resin has the thick second top layer of the semiconductor device, the boundary of the resin layer becomes vague, which may greatly deteriorate the accuracy of image recognition.

In manufacturing the semiconductor devices having the laminated layers of resin to stabilize the blocking voltage, it is necessary to provide a technique for improving the accuracy of image recognition in the packaging process to improve the productivity in manufacturing the semiconductor devices.

Solution to Problem

To solve the above problems, the semiconductor device of the present invention includes a semiconductor element, and a laminated structure having a first resin layer, a second resin layer, and a third resin layer disposed in this order to cover the main electrodes disposed on one side of the semiconductor element. The laminated structure includes an area having the first resin layer in contact with the second resin layer and an area having the first resin layer in contact with the third resin layer around the center of the semiconductor element.

The power converter of the present invention includes a pair of direct current terminals, and at least one alternating current terminal the number of which is equal to the phase number of the alternating current, a plurality of semiconductor switching elements each connected with one of the direct current terminals and one of the alternating current terminals, and a plurality of diodes each connected in parallel with one of the semiconductor switching elements. The semiconductor switching elements and/or the diodes are the semiconductor devices of the present invention.

Advantageous Effects of Invention

The semiconductor device of the present invention can stabilize the blocking voltage and improve the productivity in manufacturing the semiconductor devices.

DESCRIPTION OF EMBODIMENTS

The semiconductor device of the present invention includes a semiconductor element, and a laminated structure having a first resin layer, a second resin layer, and a third resin layer disposed in this order to cover the main electrodes disposed on one side of the semiconductor element. The laminated structure includes an area having the first resin layer in contact with the second resin layer and an area having the first resin layer in contact with the third resin layer around the center of the semiconductor element.

Some embodiments of the present invention will now be described as Examples with reference to the accompanying drawings.

Example 1

Figure 1:
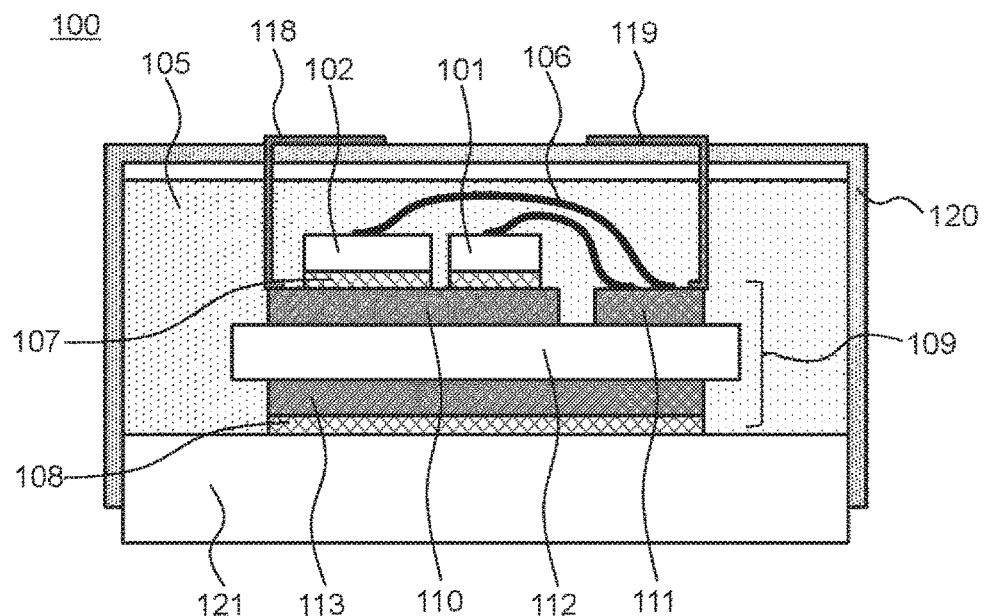
FIG. 1 is a schematic cross-sectional view of a power semiconductor module including the semiconductor device according to a first embodiment (Example 1) of the present invention.

FIG. 1 is a schematic cross-sectional view of a power semiconductor module 100 including the semiconductor device according to a first embodiment (Example 1) of the present invention. The power semiconductor module 100 includes a radiating base 121, a ceramic circuit board 109, a freewheel diode 101, a switching element 102, external output terminals 118 and 119, and a module casing 120. The ceramic circuit board 109 has a wiring pattern 110 connected with the freewheel diode 101 and the switching element 102, and a wiring pattern 111 connected with the external output terminal 119 on one side; and a metal pattern 113 connected with the radiating base 121 on the other side. The metal pattern 113 is connected with the radiating base 121 via a joining layer 108 made of solder or sintered metal paste. The wiring pattern 110 is connected with the freewheel diode 101 and the switching element 102 via a joining layer 107 made of solder or sintered metal paste. The external output terminal 118 to be connected with a positive electrode is connected with the wiring pattern 110 and the external output terminal 119 to be connected with a negative electrode is connected with the wiring pattern 111. The external output terminals 118 and 119 are drawn out of the module casing 120 to be connected with other device.

The freewheel diode 101 and the switching element 102 are connected with the wiring pattern 111, which is connected with the external output terminal 119, via bonding wires 106 on the side opposite to the side connected with the wiring pattern 110.

The module casing 120 is secured to the radiating base 121 and filled with a resin layer 105. The resin layer 105 is made of a silicone gel, for example.

The structures of the semiconductor chip and the resin layer will now be described as to the freewheel diode 101, for example. Although the freewheel diode 101 may be a silicon PiN diode, the freewheel diode 101 in this example is a SiC SBD. The following can be applied to other diodes of different materials or with different structures, or the switching element 102 (such as a silicon IGBT, a silicon MOSFET, a SiC MOSFET, and a SiC junction field-effect transistor (JFET)).

Figure 2:
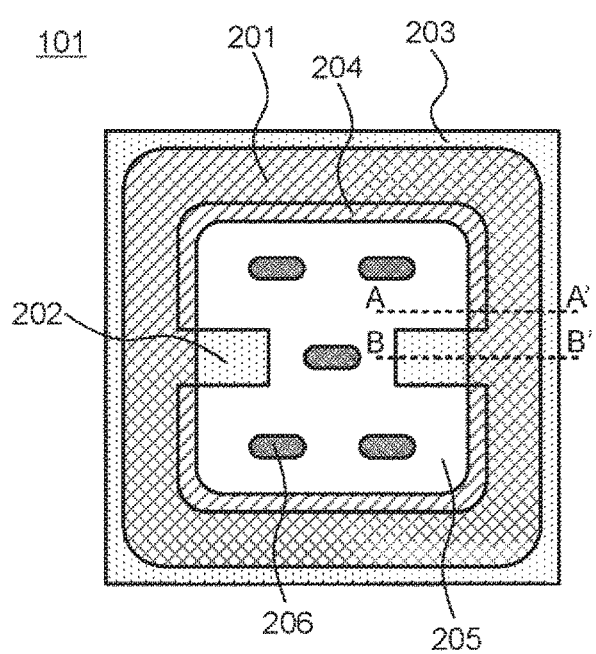
FIG. 2 is a plane view of the semiconductor device according to the first embodiment (Example 1) of the present invention.
Figure 3:
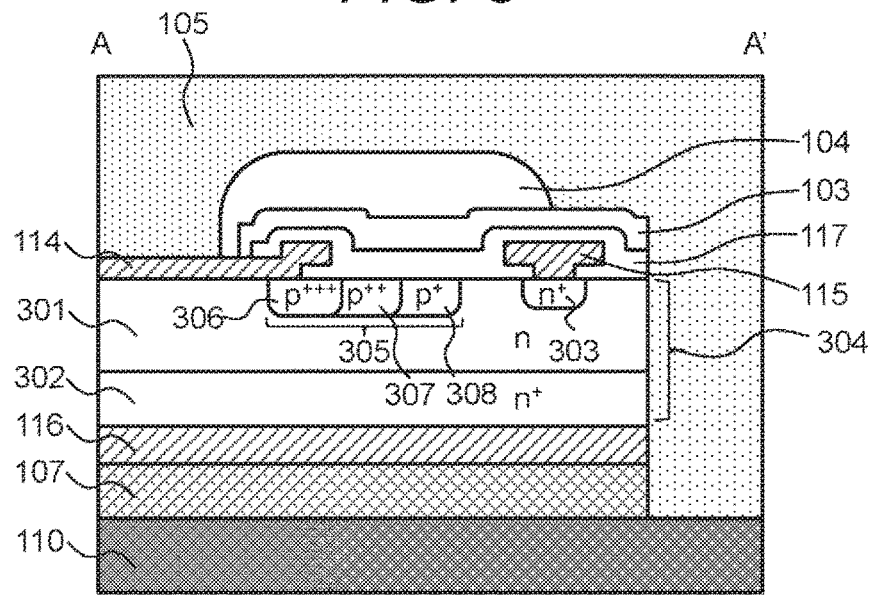
FIG. 3 is a cross-sectional view of FIG. 2 taken along the line A-A'.
Figure 4:
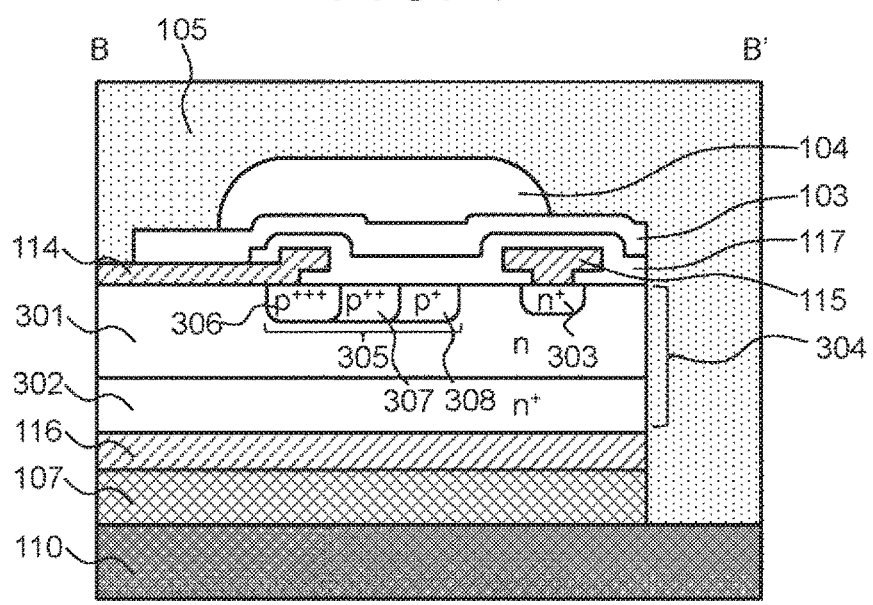
FIG. 4 is a cross-sectional view of FIG. 2 taken along the line B-B'.

FIG. 2 is a plane view of the freewheel diode 101. FIG. 3 is a schematic cross-sectional view of FIG. 2 taken along the line A-A' and FIG. 4 is a schematic cross-sectional view of FIG. 2 taken along the line B-B'. The structure of the freewheel diode 101 will now be described in detail with reference to FIG. 3. The freewheel diode 101 includes a cathode electrode 116 connected with the joining layer 107, an anode electrode 114, an auxiliary electrode 115, and a semiconductor layer 304. The semiconductor layer 304 includes an $n^+$ area 302 on the cathode electrode 116, an n area 301 disposed on the $n^+$ area 302 and having a lower impurity concentration than the $n^+$ area 302, a field limiting area 305 disposed in the n area 301 and constituting the top surface of the semiconductor layer 304, and an $n^+$ area 303 on which the auxiliary electrode 115 is disposed. The $n^+$ area 303 functions as a channel stopper at the end of the semiconductor layer 304 to prevent the leakage of the field beyond the $n^+$ area 303.

As described above, the field limiting area 305 constitutes the top surface of the semiconductor layer 304 and surrounds the anode electrode. In this embodiment, the field limiting area includes a $p^{+++}$ area 306 having the highest impurity concentration, a $p^{++}$ area 307 having a lower impurity concentration than the $p^{+++}$ area 306, and a $p^+$ area 308 having a lower impurity concentration than the $p^{++}$ area 307 disposed in this order in the direction from the anode electrode 114 to the auxiliary electrode 115, which can effectively prevent the field concentration. A field limiting ring (FLR) as a field limiting area can also effectively prevent the field concentration.

The upper structure of the freewheel diode 101 above the semiconductor layer 304 will now be described. An inorganic layer 117 is disposed on the field limiting area 305 and the $n^+$ area 303. The inorganic layer 117 is generally made of a silicon oxide layer (a $SiO_2$ layer).

A lower resin layer 103, a middle resin layer 104, and an upper resin layer 105 are disposed in this order on the inorganic layer 117. The inorganic layer 117, the lower resin layer 103, the middle resin layer 104, and the upper resin layer 105 are made of the following materials so that the difference between the relative dielectric constant of the inorganic layer 117 and the relative dielectric constant of the upper resin layer 105 is small, and both of the relative dielectric constants of the lower resin layer 103 and the middle resin layer 104 are in the range of the relative dielectric constant of the upper resin layer 105 to the relative dielectric constant of the inorganic layer 117, which restricts the variations in the dielectric constants and restricts the effects of accumulation of charges. This stabilizes the blocking voltage. When the inorganic layer 117 is a silicon oxide layer having a relative dielectric constant of 4.1, the lower resin layer 103 is made of a polyimide (a relative dielectric constant of 2.9), the middle resin layer 104 is made of a polyether amide (a relative dielectric constant of 3.2), and the upper resin layer 105 is made of a silicone gel (a relative dielectric constant of 2.7). The middle resin layer 104 may be made of a polyamide imide, a polyether amide imide, or a compound of these materials. According to the findings made by the inventors, when the power semiconductor module 100 is rated at 3.3 kV, the middle resin layer 104 should preferably have a thickness of 50 μm or more to stabilize the blocking voltage. The lower resin layer 103 is patterned by photolithography while the middle resin layer 104 is formed by coating with a dispenser to ensure the resin thickness for stabilizing the blocking voltage.

The layout of the freewheel diode 101 of the first embodiment of the present invention will now be described with reference to FIG. 2. As shown in FIG. 2, the freewheel diode 101 includes an area 201 having the inorganic layer 117, the lower resin layer 103, the middle resin layer 104, and the upper resin layer 105 laminated in this order, areas 202 and 203 having the inorganic layer 117, the lower resin layer 103, and the upper resin layer 105 laminated in this order, an area 204 having the inorganic layer 117, the middle resin layer 104, and the upper resin layer 105 laminated in this order, an area 205 having the anode electrode 114 and the upper resin layer 105 laminated in this order, and a wire bonding area 206. FIG. 2 omits an area having the anode electrode 114, the inorganic layer 117, the lower resin layer 103, and the middle resin layer 104 laminated in this order, and an area having the auxiliary electrode 115, the inorganic layer 117, the lower resin layer 103, and the middle resin layer 104 laminated in this order.

As described, the lower resin layer 103, the middle resin layer 104, and the upper resin layer 105 are laminated in this order. After the middle resin layer 104 is formed by coating with a dispenser in the packaging process, the boundary of the middle resin layer 104 (the boundary between the area 204 and the area 205 in FIG. 2) becomes vague, which may deteriorate the accuracy of image recognition in the packaging process and lower the productivity. This occurs especially in a wire bonding step in the packaging process. In the wire bonding step, image recognition takes place for positioning.

To prevent this, as shown in FIG. 2, the freewheel diode 101 of the first embodiment of the present invention includes the area 202 for facilitating image recognition after forming the middle resin layer 104. As shown in FIG. 4 or the schematic cross-sectional view of FIG. 2 taken along the line B-B', the area 202 includes the lower resin layer 103 and the upper resin layer 105 directly in contact with each other without the middle resin layer 104 therebetween. Since the lower resin layer 103 is patterned by photolithography, the boundary between the area 202 and the area 205 is clear. The clear boundary between the area 202 and the area 205 can be used as a pattern for image recognition in the wire bonding step in the packaging process, which can improve the accuracy of image recognition to improve the productivity in manufacturing the semiconductor devices.

Figure 5:
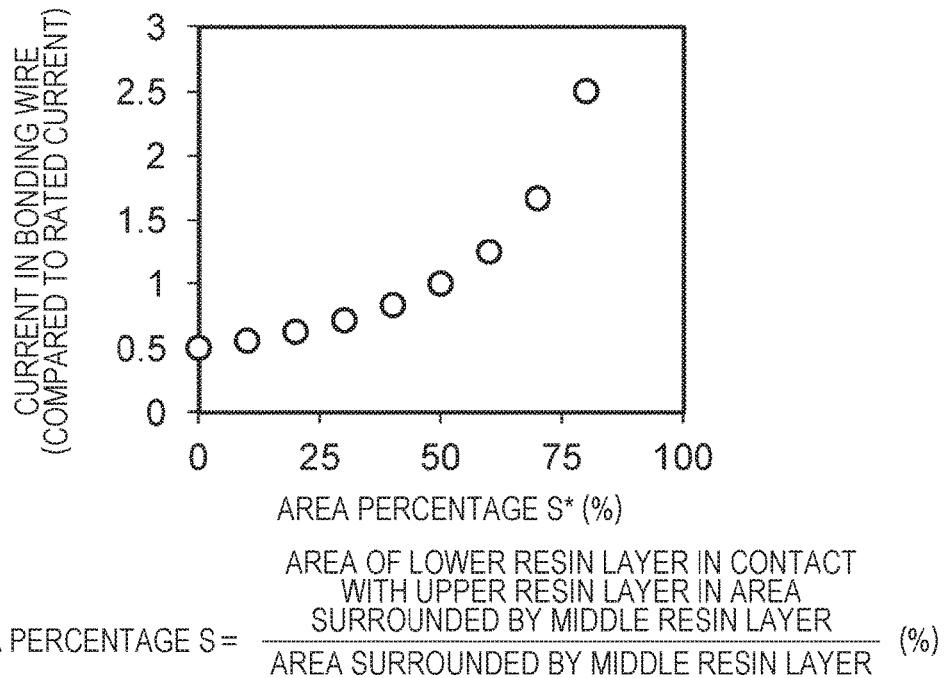
FIG. 5 is a graph showing the level of the current flowing in a bonding wire of the semiconductor device according to the first embodiment (Example 1) of the present invention.

Based on the findings made by the inventors, a desirable area percentage S of the area of the lower resin layer 103 in contact with the upper resin layer 105 in the area surrounded by the middle resin layer 104 will now be described. FIG. 5 is a graph showing the relationship between the area percentage S and the level of the current flowing in a bonding wire. In FIG. 5, the vertical axis shows the level of the current flowing in a bonding wire compared to the rated current of the bonding wire. As shown in FIG. 5, as the area percentage S increases, which lessens the total number of the bonding wires of the freewheel diode 101, the current flowing in one bonding wire increases. When the area percentage S exceeds 50%, the current flowing in the bonding wire exceeds the rated current of the bonding wire. According to the findings made by the inventors, the area percentage S should preferably exceed 1% to facilitate image recognition in the packaging process. The desirable area percentage S is thus in the range of 1% to 50%.

This embodiment can stabilize the blocking voltage with the laminated structure of the resin layers and improve the accuracy of image recognition in the packaging process to improve the productivity in manufacturing the semiconductor devices.

Example 2

Figure 6:
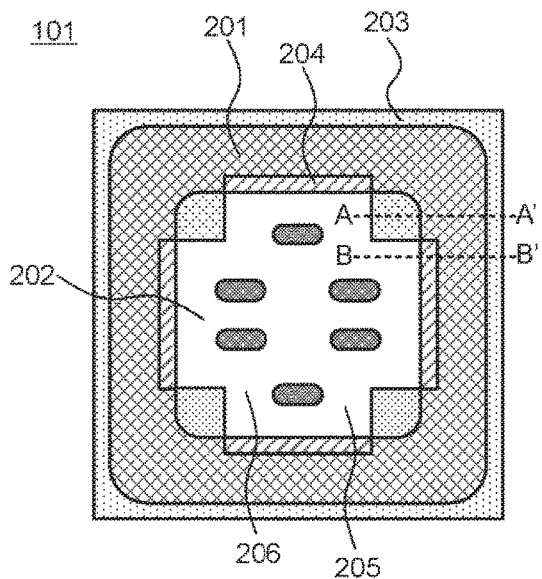
FIG. 6 is a plane view of the semiconductor device according to a second embodiment (Example 2) of the present invention.

FIG. 6 is a plane view of the semiconductor device according to a second embodiment (Example 2) of the present invention.

This example includes the area 202 having the inorganic layer 117, the lower resin layer 103, and the upper resin layer 105 laminated in this order at each of the four corners of the area 205 having the anode electrode 114 and the upper resin layer 105 laminated in this order. The schematic cross-sectional view of FIG. 6 taken along the line A-A' is the same as FIG. 3 and the schematic cross-sectional view of FIG. 6 taken along the line B-B' is the same as FIG. 4. Placing the areas 202 at the four corners of the area surrounded by the middle resin layer 104 expands the area 205 having the anode electrode 114 and the upper resin layer 105 laminated in this order, which can increase the number of bonding wires. This can increase the capacity of the semiconductor device.

This example can increase the capacity of the semiconductor device as well as achieve advantageous effects similar to those of Example 1 of the present invention.

Example 3

Figure 7:
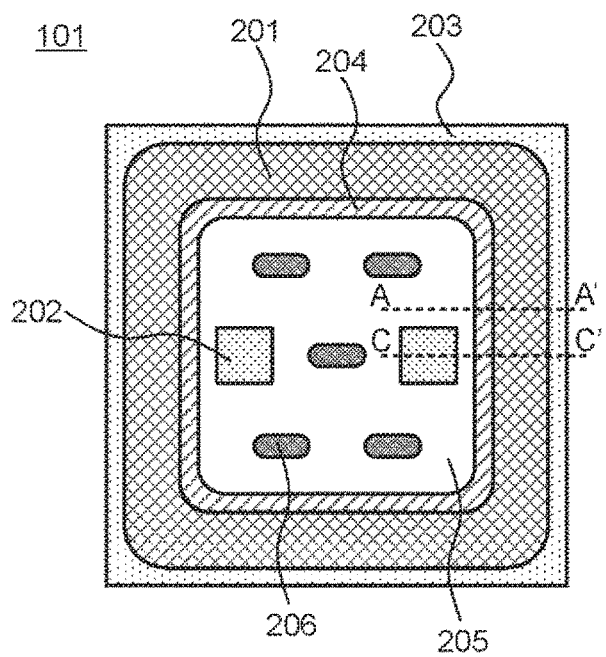
FIG. 7 is a plane view of the semiconductor device according to a third embodiment (Example 3) of the present invention.
Figure 8:
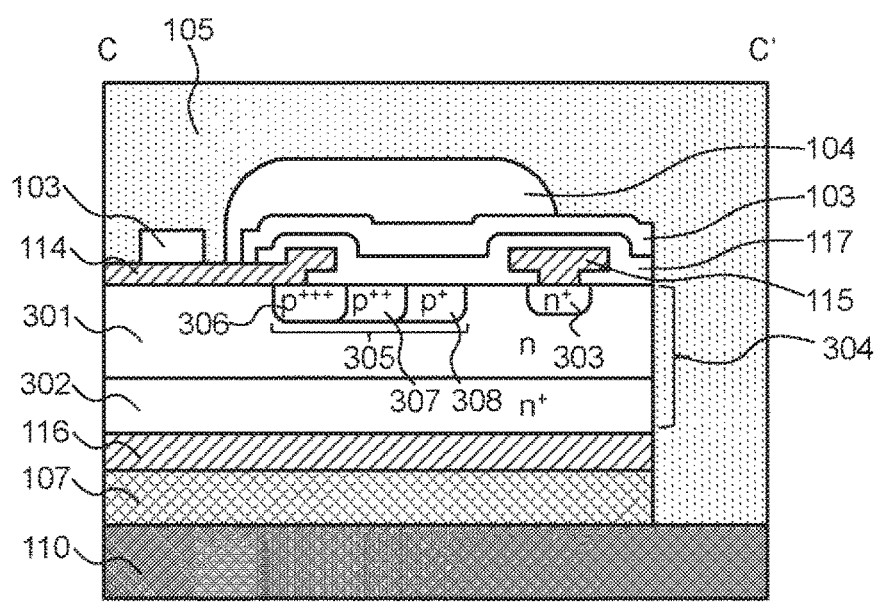
FIG. 8 is a cross-sectional view of FIG. 7 taken along the line C-C'.
Figure 9:
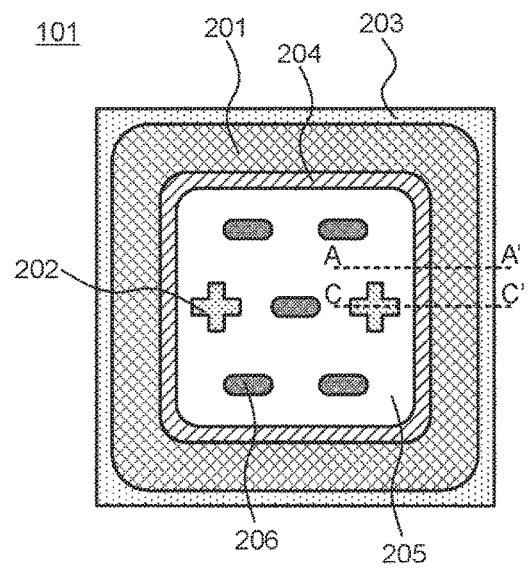
FIG. 9 is a plane view of the semiconductor device according to a modified embodiment of the third embodiment (Example 3) of the present invention.

FIG. 7 is a plane view of the semiconductor device according to a third embodiment (Example 3) of the present invention In this example, the area 202 having the inorganic layer 117, the lower resin layer 103, and the upper resin layer 105 laminated in this order is separated from the area 204 having the inorganic layer 117, the middle resin layer 104, and the upper resin layer 105 laminated in this order. The schematic cross-sectional view of FIG. 7 taken along the line A-A' is the same as FIG. 3. As shown in FIG. 8 or the schematic cross-sectional view of FIG. 7 taken along the line C-C', the lower resin layer 103 is divided near the center of the semiconductor chip. The separated area 204 shows a characteristic pattern, which can improve the accuracy of image recognition in the packaging process to improve the productivity. As shown in FIG. 9, the area 202 in the shape of a cross can achieve similar advantageous effects.

This example can further improve the productivity as well as achieve advantageous effects similar to those of Example 1 of the present invention.

Example 4

Figure 10:
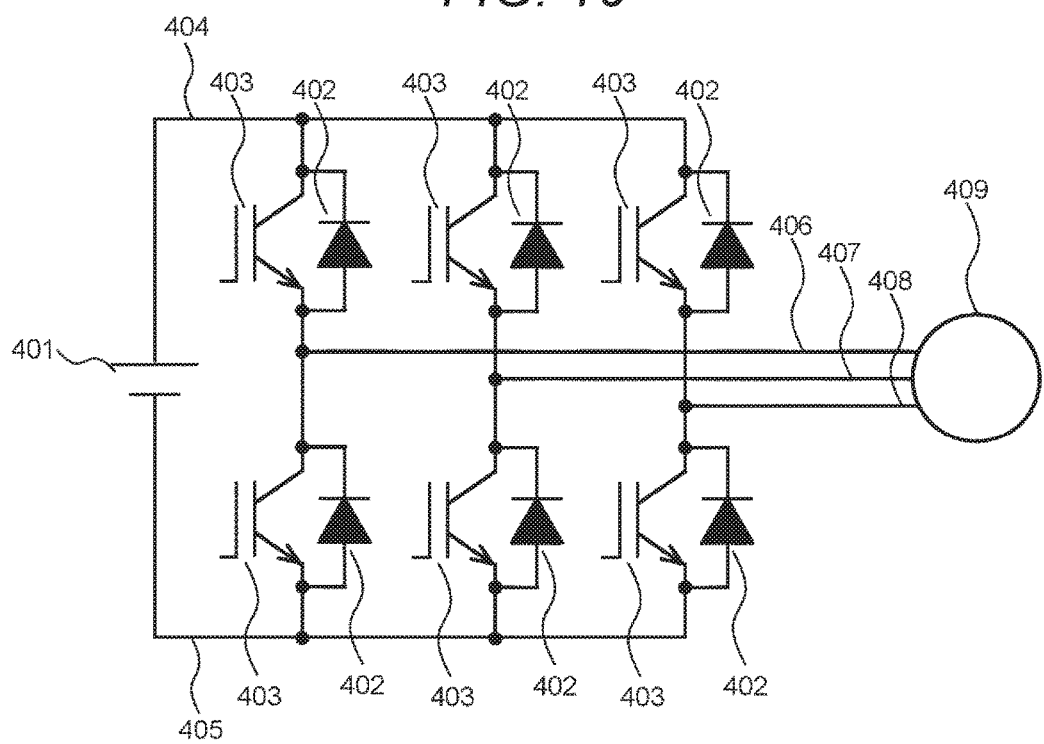
FIG. 10 is a circuit diagram representative of the power converter according to a fourth embodiment (Example 4) of the present invention.

FIG. 10 is a circuit diagram representative of the power converter according to a fourth embodiment (Example 4) of the present invention.

This example is a three-phase inverter including a pair of direct current terminals 404 and 405, three alternating current terminals 406, 407, and 408 the number of which is equal to the phase number of the alternating current. The three-phase inverter includes six switching elements 403 (such as silicon IGBTs) each connected with one of the direct current terminals and one of the alternating current terminals. Each switching element is also connected in anti-parallel with a freewheel diode 402 (such as a SiC SBD). The number of the switching elements 403 and the freewheel diodes 402 is two or more and determined depending on the phase number of the alternating current, the power capacity of the power converter, or the blocking voltage or the current capacity of a single switching element 403.

Each switching element 403 and freewheel diode 402 converts the direct current power, which is fed from a direct current power source 401 to the direct current terminals 404 and 405, into the alternating current power, which is output from the alternating current terminals 406, 407, and 408. Each alternating current output terminal is connected with a motor 409 of an induction machine or a synchronous machine so that the motor 409 is powered by the alternating current power fed from each alternating terminal for rotation.

This example applies the semiconductor devices according to one of the above first to third embodiments and the modified embodiment to the switching elements 403 and/or the freewheel diodes 402, which can stabilize the blocking voltage to improve the reliability of the inverter.

This example is an inverter, however, the semiconductor device of the present invention can be applied to other power converters such as a converter and a chopper. Similar advantageous effects can be obtained in these power converters.

Example 5

Figure 11:
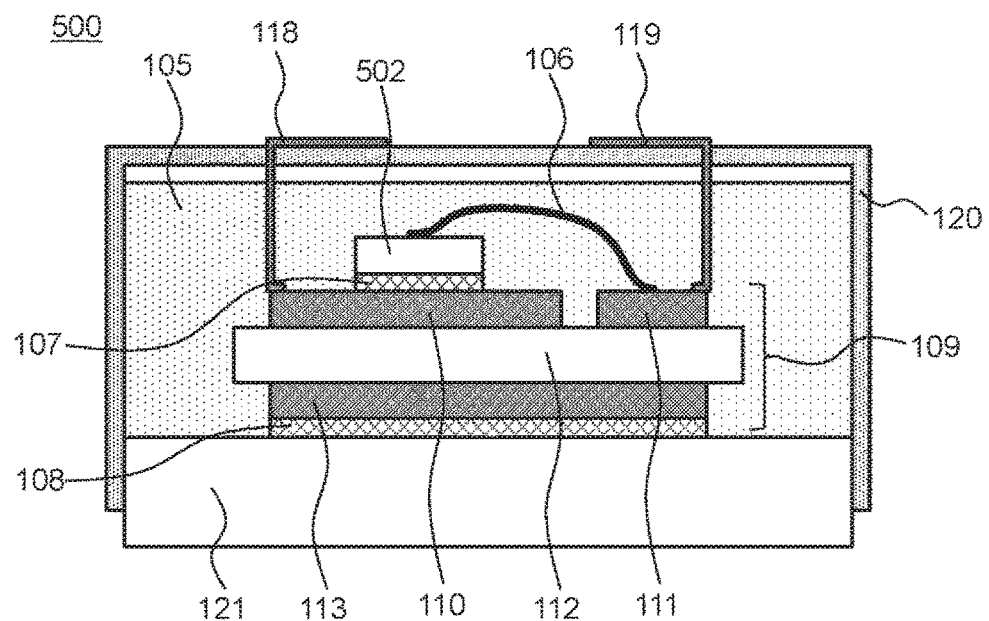
FIG. 11 is a schematic cross-sectional view of a power semiconductor module including the semiconductor device according to a fifth embodiment (Example 5) of the present invention.

FIG. 11 is a schematic cross-sectional view of a power semiconductor module 500 including the semiconductor device according to a fifth embodiment (Example 5) of the present invention.

This example includes a MOSFET as a switching element 502 and a body diode contained in the switching element 502 as a freewheel diode.

Figure 12:
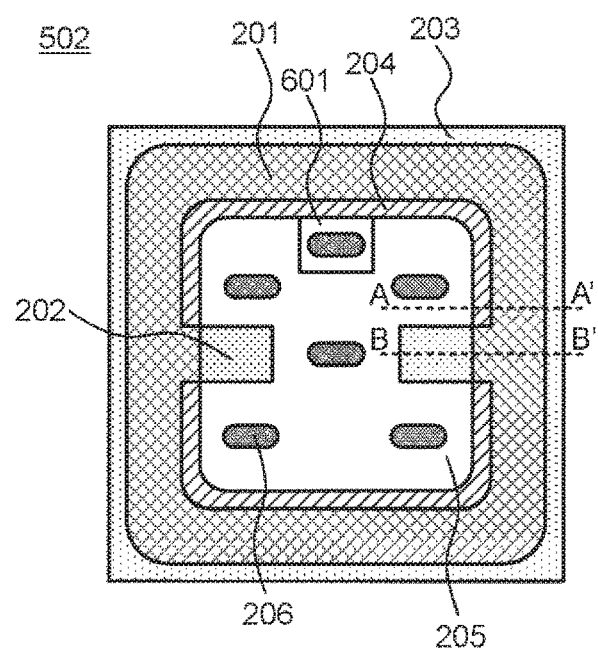
FIG. 12 is a plane view of the semiconductor device according to the fifth embodiment (Example 5) of the present invention.

FIG. 12 is a plane view of the switching element 502. The switching element 502 includes a gate pad 601. The schematic cross-sectional view of FIG. 12 taken along the line A-A' is the same as FIG. 3 and the schematic cross-sectional view of FIG. 12 taken along the line B-B' is the same as FIG. 4. The switching element 502 of a MOSFET can achieve a low loss.

This example can achieve a low loss as well as achieve advantageous effects similar to those of Example 1 of the present invention.

Example 6

Figure 13:
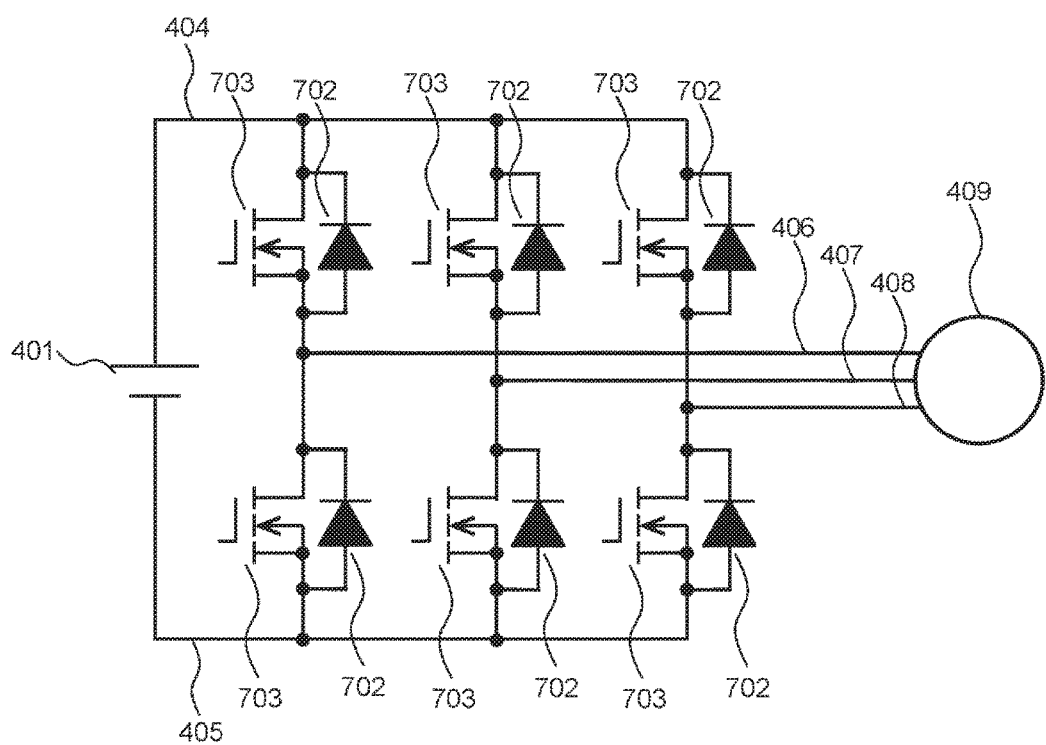
FIG. 13 is a circuit diagram representative of the power converter according to a sixth embodiment (Example 6) of the present invention.

FIG. 13 is a circuit diagram representative of the power converter according to a sixth embodiment (Example 6) of the present invention.

This example is the same as Example 4 of the present invention except that this example includes the switching elements 703 of MOSFETs and the freewheel diodes 702 of body diodes contained in the switching elements 703.

The switching elements 703 of MOSFETs can achieve a low loss to improve the efficiency of the power converter.

This example can achieve a high efficiency of the power converter as well as achieve advantageous effects similar to those of Example 4 of the present invention.

The technical scope of the present invention is not limited to the above examples and various modifications can be made within the technical scope of the present invention. For example, the semiconductor layers of the above examples may have the opposite conductivity types. The semiconductor materials for the semiconductor devices may be other wide-gap semiconductors such as GaN or silicon than SiC used in the above examples.

REFERENCE SIGNS LIST 100, 500 power semiconductor module
101 freewheel diode
102, 502 switching element
103 lower resin layer
104 middle resin layer
105 upper resin layer
106 bonding wire
107, 108 joining layer
109 ceramic circuit board
110, 111 wiring pattern
112 ceramic insulating board
113 metal pattern
114 anode electrode
115 auxiliary electrode
116 cathode electrode
117 inorganic layer
118, 119 external output terminal
120 module casing
121 radiating base
201 area having inorganic layer, lower resin layer, middle resin layer, and upper resin layer laminated in this order
202, 203 area having inorganic layer, lower resin layer, and upper resin layer laminated in this order
204 area having inorganic layer, middle resin layer, and upper resin layer laminated in this order
205 area having anode electrode and upper resin layer laminated in this order
206 wire bonding area
301 n area
302, 303 $n^+$ area
304 semiconductor layer
305, 306, 307, 308 field limiting area
401 direct current power source
402 freewheel diode
403 switching element
404, 405 direct current terminal
406, 407, 408 alternating current terminal
409 motor
601 gate pad

The invention claimed is:

1. A semiconductor device, comprising:
a semiconductor element; and
a laminated structure including a first resin layer, a second resin layer, and a third resin layer disposed in this order to cover a main electrode disposed on one side of the semiconductor element,
wherein the laminated structure includes a first area having the first resin layer in contact with the second resin layer and a second area having the first resin layer in contact with the third resin layer, both of the areas being disposed around a center of the semiconductor element,
at least part of the second area is arranged closer to the center of the semiconductor element than the first area,
the first resin layer is patterned by photolithography, and
a boundary of the at least part of the second area that is arranged closer to the center of the semiconductor element than the first area is used as a pattern for image recognition in a packaging process.

2. The semiconductor device according to claim 1, wherein the area having the first resin layer in contact with the third resin layer is separated from the area having the first resin layer in contact with the second resin layer.

3. The semiconductor device according to claim 1, wherein the area of the first resin layer in contact with the third resin layer accounts for 1% to 50% of the area surrounded by the third resin layer.

4. The semiconductor device according to claim 1, wherein an inorganic layer of $SiO_2$ is disposed under the first resin layer and the third resin layer is made of a silicone gel, and
wherein both of relative dielectric constants of the first resin layer and the second resin layer are equal to or higher than a relative dielectric constant of the third resin layer and equal to or lower than the relative dielectric constant of the inorganic layer.

5. The semiconductor device according to claim 4, wherein the first resin layer is made of a polyimide and the second resin layer is made of one material or more selected from the group consisting of a polyamide imide, a polyether amide imide, and a polyether amide.

6. The semiconductor device according to claim 1, wherein a semiconductor base material for the semiconductor element has a wider band gap than silicon.

7. The semiconductor device according to claim 6, wherein the semiconductor base material for the semiconductor element is SiC.

8. The semiconductor device according to claim 1, wherein the semiconductor element is a diode.

9. The semiconductor device according to claim 8, wherein a semiconductor base material for the semiconductor element has a wider band gap than silicon.

10. The semiconductor device according to claim 9, wherein the semiconductor base material for the semiconductor element is SiC.

11. The semiconductor device according to claim 1, wherein the semiconductor element is a metal oxide semiconductor field-effect transistor (MOSFET).

12. The semiconductor device according to claim 11, wherein a semiconductor base material for the semiconductor element has a wider band gap than silicon.

13. The semiconductor device according to claim 12, wherein the semiconductor base material for the semiconductor element is SiC.

14. A power converter, comprising:
a pair of direct current terminals;
at least one alternating current terminal the number of which is equal to the phase number of the alternating current;
a plurality of semiconductor switching elements each connected with one of the direct current terminals and one of the alternating current terminals; and
a plurality of diodes each connected in parallel with one of the semiconductor switching elements,
wherein the semiconductor switching elements and/or the diodes are the semiconductor devices according to claim 1.

15. A power converter, comprising:
a pair of direct current terminals;
at least one alternating current terminal the number of which is equal to the phase number of the alternating current; and
a plurality of semiconductor switching elements each connected with one of the direct current terminals and one of the alternating current terminals,
wherein the semiconductor switching elements are the semiconductor devices according to claim 11, and each semiconductor switching element includes a body diode.

* * * * *